(12) United States Patent
Kyoh

(10) Patent No.: US 9,217,918 B2
(45) Date of Patent: Dec. 22, 2015

(54) PHOTOMASK, PHOTOMASK MANUFACTURING APPARATUS, AND PHOTOMASK MANUFACTURING METHOD

(71) Applicant: KABUSHIKI KAISHA TOSHIBA, Minato-ku (JP)

(72) Inventor: Suigen Kyoh, Nagoya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 300 days.

(21) Appl. No.: 14/017,506

(22) Filed: Sep. 4, 2013

(65) Prior Publication Data

US 2014/0226138 A1    Aug. 14, 2014

(30) Foreign Application Priority Data

Feb. 8, 2013    (JP) ................. 2013-023555

(51) Int. Cl.
*G03B 27/42*    (2006.01)
*G03F 1/70*    (2012.01)
*G03F 1/22*    (2012.01)

(52) U.S. Cl.
CPC ... *G03F 1/70* (2013.01); *G03F 1/22* (2013.01)

(58) Field of Classification Search
CPC .......... B82Y 40/00; B82Y 30/00; G03F 1/38; G03F 1/24; G03F 1/72; G03F 1/144; G03F 1/64; G03F 1/36; G03F 1/70; G03F 1/84; G03F 7/70283; G03F 7/703; G03F 1/14; G03F 1/60; G03F 7/707; G03F 7/70783; G03F 7/70433
See application file for complete search history.

(56) References Cited

U.S. PATENT DOCUMENTS

2012/0141927 A1    6/2012    Kamo

FOREIGN PATENT DOCUMENTS

| JP | 2009-177126 | 8/2009 |
| JP | 2010-122304 | 6/2010 |
| JP | 2012-124214 | 6/2012 |

OTHER PUBLICATIONS

S. Yoshitake, et al., "Desired IP Control methodology for EUV Mask in Current Mask Process", 24th European Mask and Lithography Conference, Proc. of SPIE, vol. 6792, Jun. 15, 2010, pp. 67920T-1-67920T-11.

Byounghoon Lee, et al., "Process Overlay Controllability in EUV Lithography", International Symposium on Extreme Ultraviolet Lithography, Process Optimization, Session 5, Oct. 2011, pp. 1-22.

*Primary Examiner* — Mesfin T Asfaw
(74) *Attorney, Agent, or Firm* — Oblon, McClelland, Maier & Neustadt, L.L.P.

(57) ABSTRACT

A photomask according to the present embodiment is used to transfer a pattern to a transfer target substrate in a non-telecentric optical system. A mask substrate includes a first face having a pattern formed thereon and a second face on an opposite side from the first face. A convex portion or a concave portion is formed on the second face in order to correct a position difference in a transfer pattern occurring when the pattern is transferred to the transfer target substrate. The convex portion is formed of a material different from that of the mask substrate.

18 Claims, 6 Drawing Sheets

PHOTOMASK, PHOTOMASK MANUFACTURING APPARATUS, AND PHOTOMASK MANUFACTURING METHOD

CROSS REFERENCE TO RELATED APPLICATIONS

This application is based upon and claims the benefit of priority from the prior Japanese Patent Application No. 2013-023555, filed on Feb. 8, 2013, the entire contents of which are incorporated herein by reference.

FIELD

The embodiments of the present invention relate to a photomask, a photomask manufacturing apparatus, and a photomask manufacturing method.

BACKGROUND

To produce a downscaled semiconductor device, an exposure apparatus using extreme ultra violet (EUV) light (hereinafter, also "EUV exposure apparatus") has been developed. The EUV exposure apparatus includes a plurality of mirrors to perform exposure and transfer from a photomask to a semiconductor substrate being a transfer target substrate. However, the mirror reflectance of the EUV light is relatively low and thus a limit is set on the number of mirrors to suppress a reduction in a light amount of the EUV light reaching the semiconductor substrate. When the number of mirrors is small, the flexibility of correcting a position difference (an overlay error) between a ground pattern of the semiconductor substrate and a transfer pattern to be exposed is reduced. Actually, in the EUV exposure apparatus, high-order correction on overlay is difficult to perform and it is hard to enhance overlay accuracy associated with downscaling of the semiconductor device.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A photomask according to the present embodiment is used to transfer a pattern to a transfer target substrate in a non-telecentric optical system. A mask substrate includes a first face having a pattern formed thereon and a second face on an opposite side from the first face. A convex portion or a concave portion is formed on the second face in order to correct a position difference in a transfer pattern occurring when the pattern is transferred to the transfer target substrate. The convex portion is formed of a material different from that of the mask substrate.

First Embodiment

Figure 1:
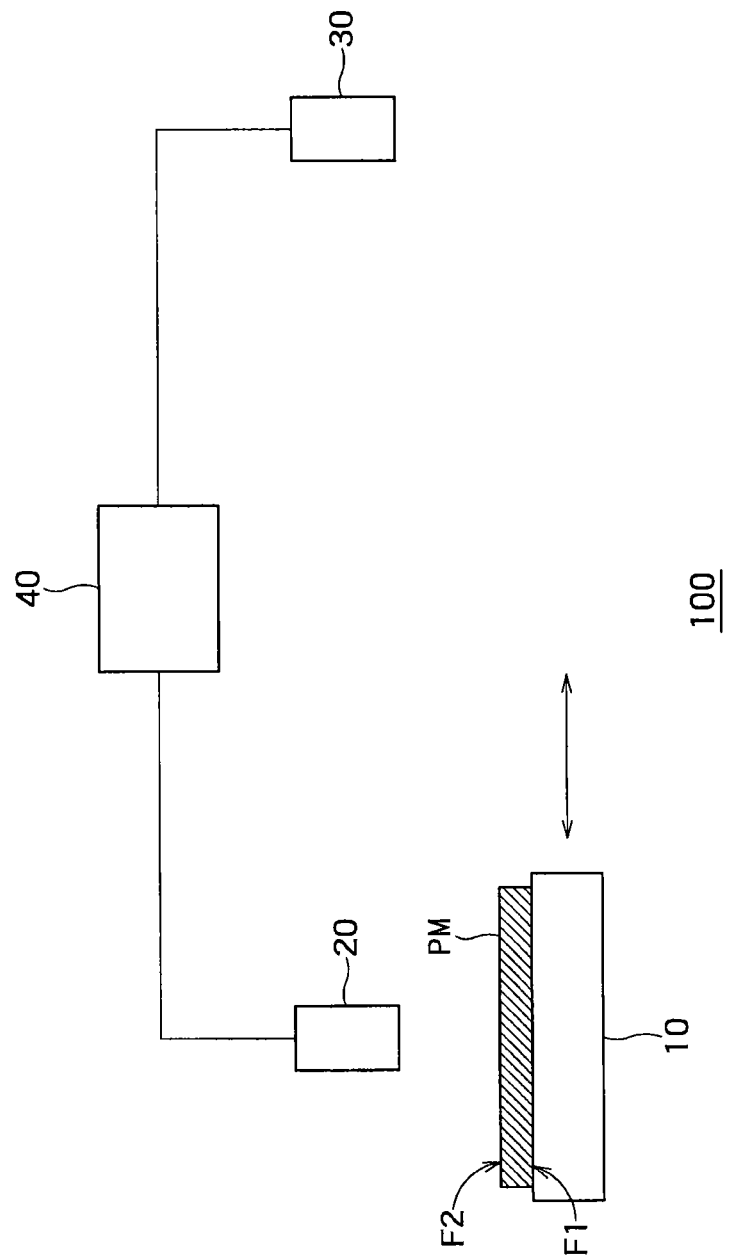
FIG. 1 shows a configuration example of a photomask creation apparatus 100 according to a first embodiment.

FIG. 1 shows a configuration example of a photomask manufacturing apparatus 100 according to a first embodiment. The photomask manufacturing apparatus 100 manufactures a photomask PM to be used to transfer a pattern to a semiconductor substrate being a transfer target substrate in a non-telecentric optical system such as an EUV exposure apparatus. In the non-telecentric optical system, chief rays are not parallel to the optical axis. Therefore, a phenomenon in which the size of a transfer pattern varies on an image field (the transfer target substrate, for example) or in which an alignment of the transfer pattern is shifted occurs when an object (the photomask, for example) moves in the direction of the optical axis. In the EUV exposure apparatus, the non-telecentric optical system is adopted on an object side on which the photomask is placed. In the first embodiment, an overlay error is corrected by purposely using this property of the non-telecentric optical system.

The photomask manufacturing apparatus 100 includes a stage 10, a spotter 20 serving as a level-difference formation unit, a laser generation unit 30 serving as a solidification unit, and a controller 40. The photomask PM is mounted on the stage 10. In a state where a first face F1 of the photomask PM having a circuit pattern formed thereon faces downward and a second face F2 on the opposite side from the first face F1 faces upward, the photomask PM is mounted on the stage 10. The stage 10 can freely move the photomask PM to form a convex portion at an arbitrary position on the second face F2 of the photomask PM.

To form a convex portion on the photomask PM, the spotter 20 serving as a level-difference formation unit supplies a material of the convex portion onto the second face F2 of the photomask PM. The material is not particularly limited and can be either a fluid material or a solid material. The method of supplying a fluid material is not particularly limited and can be any of dripping, coating, spraying, and the like. The method of supplying a solid material is not particularly limited and can be any of injection, sputtering, and the like. It is assumed hereinafter that the spotter 20 supplies a fluid material. In the first embodiment, the spotter 20 drips the fluid material on the second face F2. The fluid material can be, for example, coating carbon or resin containing metal and desirably has conductivity.

The laser generation unit 30 serving as the solidification unit applies laser light to the fluid material dripped on the second face F2 to solidify the fluid material supplied onto the photomask PM. The solidification unit is not particularly limited as long as it solidifies the fluid material. The solidification unit can be, for example, a light source of IR (Infrared Radiation) light, visible light, UV (Ultraviolet) light, or the like, or a heat source. The method of solidifying the fluid material is not particularly limited and can be drying, sintering, or the like.

The controller 40 controls the operation of the stage 10, the amount of the fluid material dripped from the spotter 20, the timing of the dripping, the application time of the laser from the laser generation unit 30, and the like.

Figure 2A:
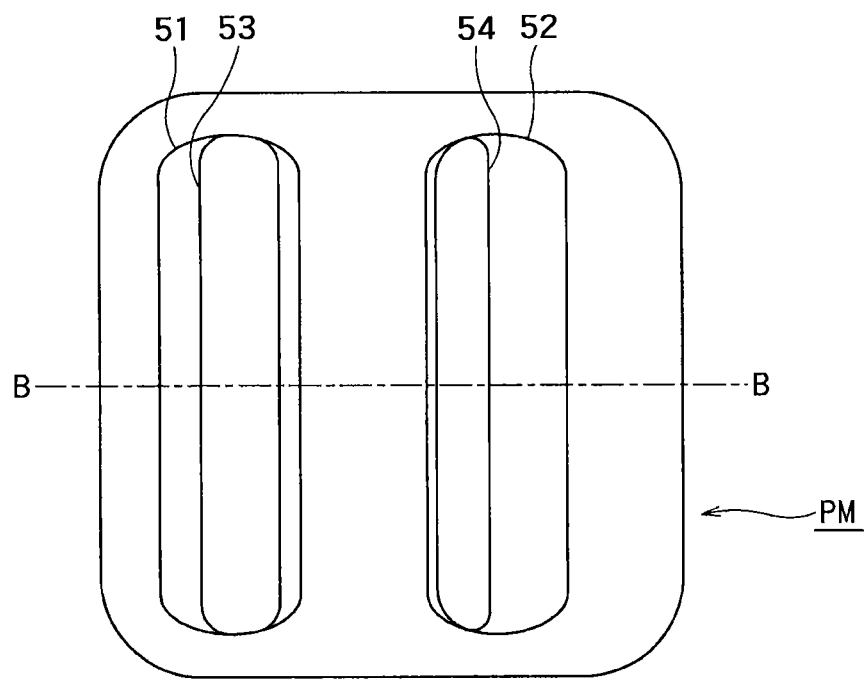
FIGS. 2A and 2B are a plan view and a sectional view showing a configuration of the photomask PM according to the first embodiment.
Figure 2B:
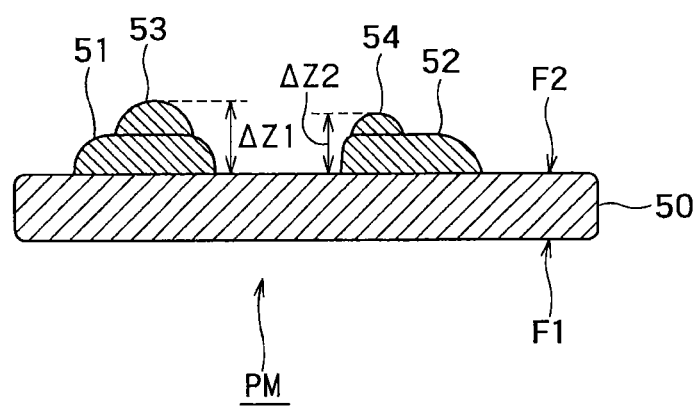

FIGS. 2A and 2B are a plan view and a sectional view showing a configuration of the photomask PM according to the first embodiment. FIG. 2A is a plan view of the second face F2. FIG. 2B is a sectional view along a line B-B in FIG. 2A. The photomask PM is a photomask (a reticle, for example) used to transfer a pattern to a semiconductor substrate in a non-telecentric optical system as mentioned above. Convex portions 51 to 54 in FIGS. 2A and 2B are schematically shown and represented in an exaggerated manner than that of the actual convex portions.

The photomask PM includes a mask substrate 50 and the convex portions 51 to 54. The mask substrate 50 has the first face F1 and the second face F2 on the opposite side from the first face F1. A circuit pattern to be exposed and transferred to a semiconductor substrate is formed on the first face F1. The convex portions 51 to 54 are formed on the second face F2 to correct a position difference (an overlay error) in a transfer pattern occurring when the circuit pattern is transferred to a semiconductor substrate. In this case, the circuit pattern is a pattern on the photomask PM formed on the first face F1. The transfer pattern is a pattern transferred to the front face of a semiconductor substrate when the circuit pattern is exposed to the semiconductor substrate using the photomask PM. The overlay error is a horizontal difference in the transfer pattern with respect to a ground pattern formed on a semiconductor substrate W shown in FIG. 3.

The convex portions 51 to 54 are formed of a material different from that of the mask substrate 50. For example, the mask substrate 50 is formed of a glass material and the convex portions 51 to 54 are formed of carbon or resin.

The convex portions 51 to 54 are formed by solidifying the fluid material dripped from the spotter 20 with the laser light from the laser generation unit 30. The laser generation unit 30 can locally apply laser to a part of the second face F2 of the photomask PM. Therefore, the laser generation unit 30 can sinter the convex portions 51 to 54 without thermally treating the entire photomask PM.

Planar shapes and heights (sizes of differences in levels) ΔZ1 and ΔZ2 of the convex portions 51 to 54 are determined to some extent by a dripping speed and a dripping amount of the fluid material dripped from the spotter 20 and a movement direction and a movement speed of the stage 10 while the spotter 20 supplies the fluid material. To adjust the planar shapes and heights of the convex portions 51 to 54, the convex portions 51 to 54 can have a layered structure as shown in FIGS. 2A and 2B. For example, when it is determined after the convex portions 51 and 52 are formed that the convex portions 51 and 52 are not sufficiently high, the photomask manufacturing apparatus 100 can perform again the supply of the fluid material and the solidification of the fluid material to form the convex portions 53 and 54 on the convex portions 51 and 52, respectively.

When the convex portions 51 to 54 are too large, the laser generation unit 30 can apply laser to the convex portions 51 to 54 in an oxygen atmosphere, thereby scraping (burning off) the convex portions 51 to 54. Alternatively, when the convex portions 51 to 54 are too large, parts of the convex portions 51 to 54 can be removed by ashing using an ashing apparatus.

The reason why an overlay error in the transfer pattern is corrected by the convex portions 51 to 54 will be explained below.

Figure 3:
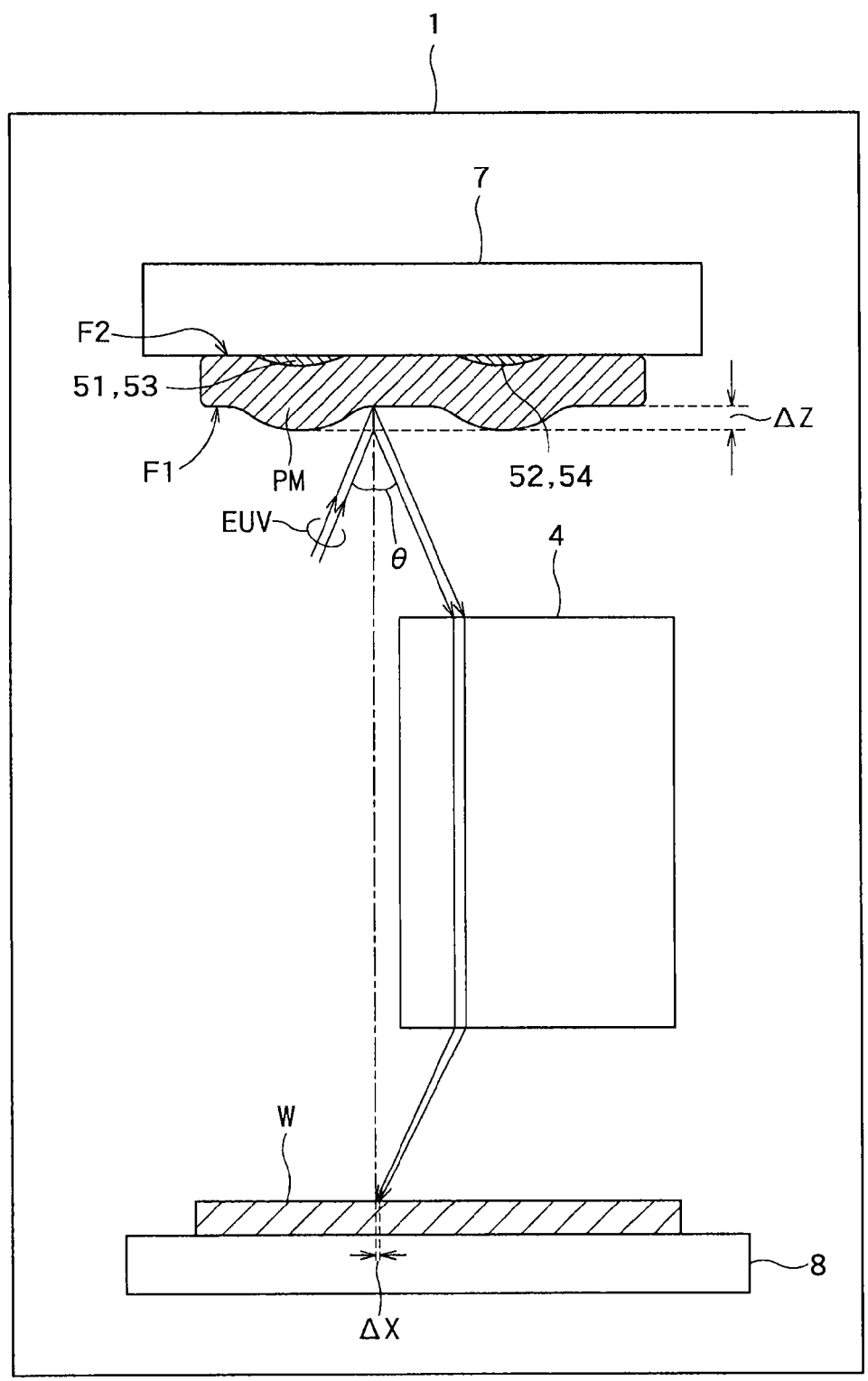
FIG. 3 shows an EUV exposure apparatus 200 that performs exposure using the photomask PM according to the first embodiment.

FIG. 3 shows an EUV exposure apparatus 200 that performs exposure using the photomask PM according to the first embodiment.

The EUV exposure apparatus 200 includes a vacuum chamber 1, a reticle stage 7, a wafer stage 8, and an optical system 4. The inside of the vacuum chamber 1 is maintained vacuum (a reduced-pressure atmosphere at about $1 \times 10^{-4}$ pascal, for example). The reticle stage 7, the wafer stage 8, and the optical system 4 are provided in the vacuum chamber 1 and exposure with EUV light is performed in the vacuum chamber 1.

The reticle stage 7 has an electrostatic chuck and the photomask (that is, the reticle) PM is mounted thereon for exposure of the semiconductor substrate W. The reticle stage 7 is provided to be able to move in a scan direction during exposure. The electrostatic chuck of the reticle stage 7 adsorbs and fixes the photomask PM on the reticle stage 7. In this case, the reticle stage 7 adsorbs the second face F2 (a rear face) of the photomask PM having the convex portions 51 to 54 formed thereon. A mount face of the reticle stage 7 is flat and is formed of a material with a high hardness, such as ceramic. Therefore, when the reticle stage 7 adsorbs the photomask PM, the first face F1 of the photomask PM is stretched and extruded by the convex portions 51 to 54 so that the first face F1 has concavities and convexities (differences in levels or steps). Accordingly, the circuit pattern formed on the first face F1 has concavities and convexities.

The wafer stage 8 has an electrostatic chuck and the semiconductor substrate W as an exposure target is mounted thereon. The wafer stage 8 is provided to be able to move in the scan direction during exposure. The electrostatic chuck of the wafer stage 8 fixes the semiconductor substrate W on the wafer stage 8.

The optical system 4 exposes and transfers the circuit pattern that is formed on the photomask PM mounted on the reticle stage 7 onto the semiconductor substrate W mounted on the wafer stage 8. At the time of exposure, the optical system 4 exposes the semiconductor substrate W with exposure light reflected on the photomask PM. That is, the optical system 4 projects the pattern formed on the first face F1 of the photomask PM onto the semiconductor substrate W. A photosensitive material (resist, for example) is previously coated on the front face of the semiconductor substrate W and the exposure light (EUV light) exposes the photosensitive material on the semiconductor substrate W. The exposure is performed while the reticle stage 7 and the wafer stage 8 are scanned in the scan direction.

It is assumed in this case that the size of the differences in levels on the first face F1 extruded by the convex portions 51 to 54 (with heights of Z1 and Z2) of the photomask PM is ΔZ. It is assumed that an angle formed by a direction perpendicular to the first face F1 of the photomask PM and an incidence direction of the EUV light entering the photomask PM is θ. It is assumed that a reduction ratio of the transfer pattern from the photomask PM onto the semiconductor substrate W in the optical system 4 is M. It is also assumed that a correction value (that is, an overlay correction value) of the position of the transfer pattern on the semiconductor substrate W depending on the size ΔZ of the level differences is ΔX. In this case, the following Expression 1 holds.

$$\Delta Z = \Delta X / (M \times \tan \theta) \qquad \text{(Expression 1)}$$

That is, the level differences ΔZ on the first face F1 of the photomask PM can shift (correct) the position of the transfer pattern on the semiconductor substrate W by ΔX. This can be rephrased as that the convex portions 51 to 54 formed on the second face F2 of the photomask PM can correct the position of the transfer pattern on the semiconductor substrate W.

Figure 4:
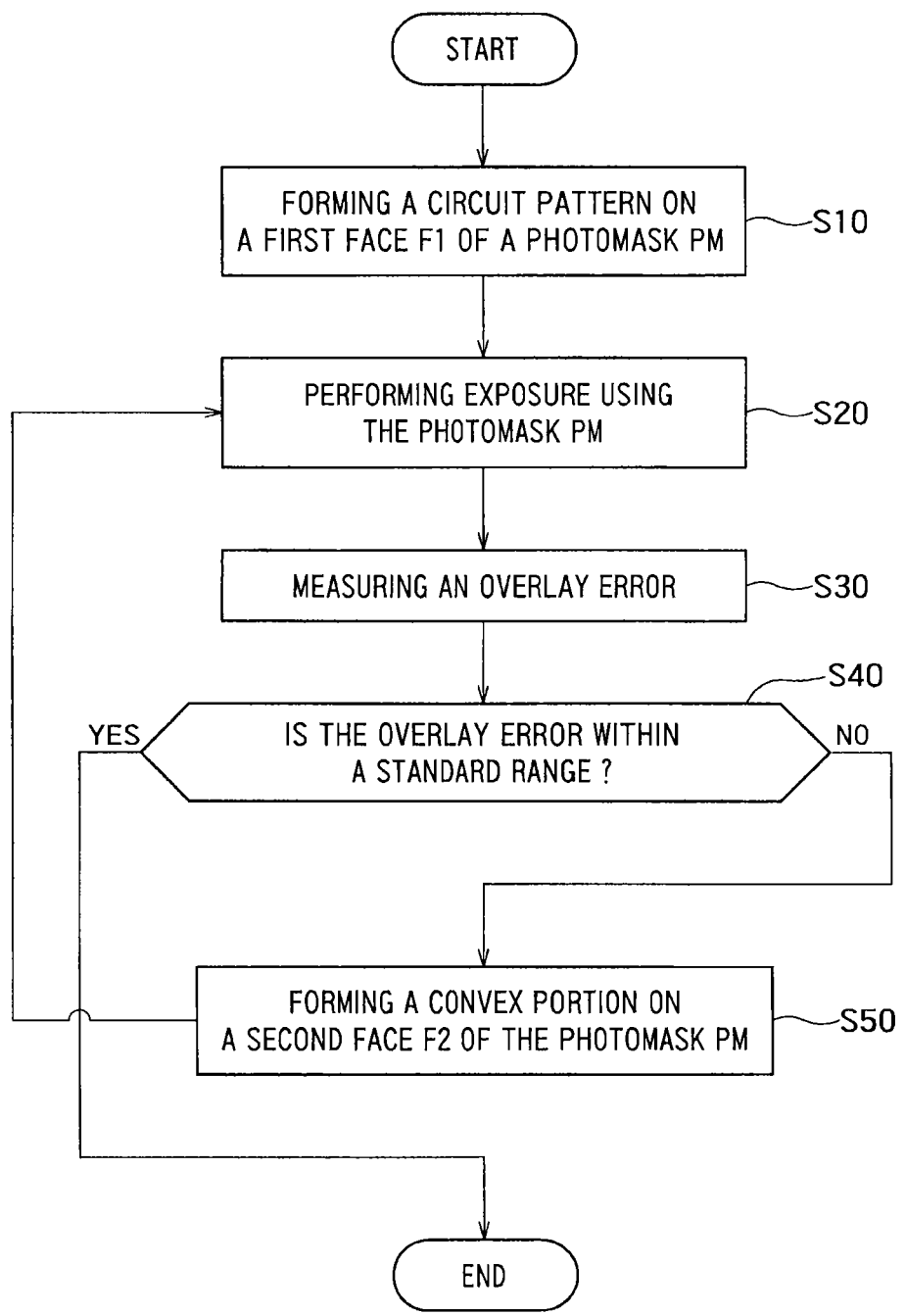
FIG. 4 is a flowchart showing a method of creating the photomask PM according to the first embodiment.

FIG. 4 is a flowchart showing a method of manufacturing the photomask PM according to the first embodiment. The photomask PM is manufactured as follows.

A circuit pattern is first formed on the first face F1 of the photomask PM (Step S10). Formation of the circuit pattern can be performed by an apparatus different from the photomask manufacturing apparatus 100 according to the first embodiment.

Exposure is then performed using the photomask PM in the exposure apparatus 200 (Step S20). At that time, the exposure apparatus 200 measures a position difference (an overlay error) in the transfer pattern on the semiconductor substrate W (Step S30). The overlay error is preferably measured at a plurality of positions on a plane of the photomask PM. For example, the overlay error can be measured at a plurality of grid points set in the plane of the photomask PM. In this way, the overlay error is evenly measured on the plane of the photomask PM.

When the overlay error at each grid point is within a previously set standard range (YES at Step S40), the photomask PM can be used as it is for production of a semiconductor device. Therefore, manufacturing of the photomask PM is ended.

Meanwhile, when the overlay error at a certain grid point is out of the previously set standard range (NO at Step S40), the photomask manufacturing apparatus 100 forms convex portions on the second face F2 of the photomask PM (Step S50). The photomask manufacturing apparatus 100 determines formation positions of the convex portions, a supply amount of a fluid material, and the like according to a position on the photomask PM where the overlay error occurs, a measurement value of the overlay error, and the like. When Expression 1 is used in this case assuming the overlay error as ΔX, the size ΔZ of a level difference required for correction can be calculated. A relation of the size ΔZ of the level difference on the first face F1 and the sizes ΔZ1 and ΔZ2 of the convex portions 51 to 54 and the positions thereof on the second face F2 can be previously set by a simulation such as a stress analysis, an empirical rule, or the like. Furthermore, the supply amount of the fluid material required to form the convex portions 51 to 54 with desired heights can be previously set by an empirical rule, or the like. It can be confirmed by a simulation that the convex portions expected to be formed can reduce the overlay error before actually forming the convex portions 51 to 54. Furthermore, after the convex portions 51 to 54 are actually formed, the shapes such as the heights and sizes of the formed convex portions can be measured and then it can be confirmed by a simulation that the convex portions can reduce the overlay error.

After the convex portions are formed, processes at Steps S20 to S40 are performed again. The processes at Steps S20 to S40 are repeated until the overlay error at each grid point falls within the standard range. In this way, the method according to the first embodiment can correct the overlay error. When the number of repetitions of the processes at Steps S20 to S40 exceeds a predetermined value, re-creation of the circuit pattern itself of the photomask PM is conceivable.

As described above, the photomask manufacturing apparatus and the photomask manufacturing method according to the first embodiment can correct an overlay error on the semiconductor substrate W by forming the convex portions 51 to 54 on the second face (the rear face) of the photomask PM. When exposure is performed using this photomask PM, overlay accuracy in a ground pattern of the semiconductor substrate W and an exposed transfer pattern is enhanced, which results in an increased yield.

Furthermore, according to the first embodiment, an overlay error that cannot be corrected by the EUV exposure apparatus 200 can be corrected. That is, according to the first embodiment, high-order correction on overlay that cannot be performed by an EUV exposure apparatus can be achieved with the configuration of the photomask PM.

Second Embodiment

Figure 5A:
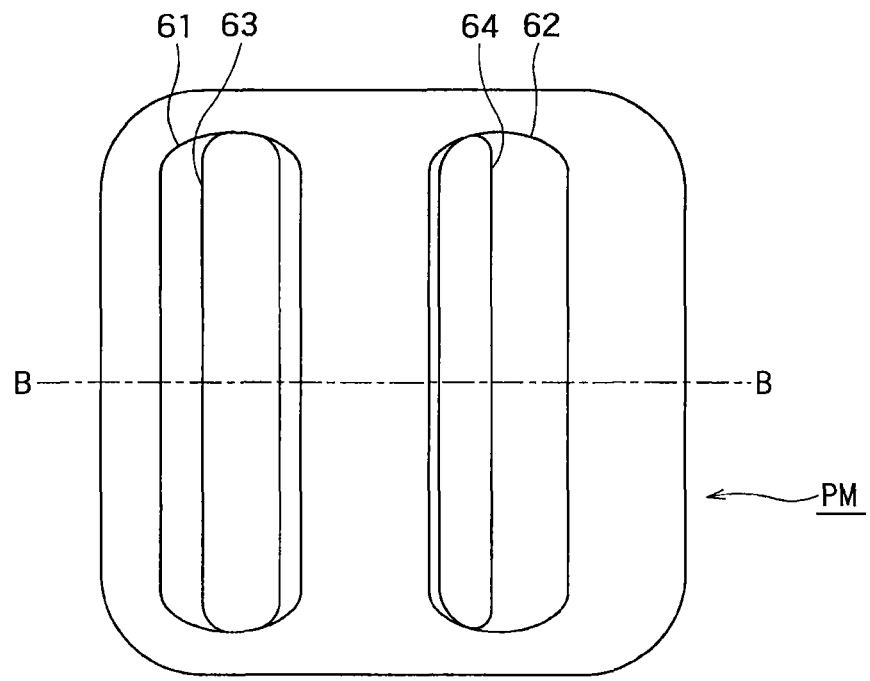
FIGS. 5A and 5B are a plan view and a sectional view showing a configuration of the photomask PM according to a second embodiment.
Figure 5B:
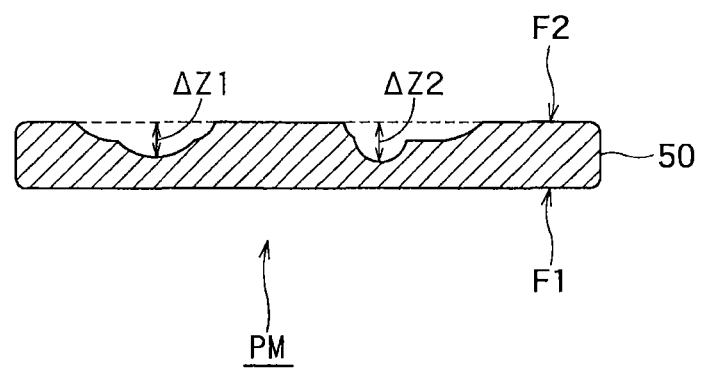

FIGS. 5A and 5B are a plan view and a sectional view showing a configuration of the photomask PM according to a second embodiment. FIG. 5A is a plan view of the second face F2. FIG. 5B is a sectional view along a line B-B in FIG. 5A. The second embodiment is different from the first embodiment in that the photomask PM includes concave portions 61 to 64 instead of the convex portions. Other configurations of the photomask PM according to the second embodiment can be identical to those according to the first embodiment.

The concave portions 61 to 64 can be formed by forming a new film with a uniform thickness on the second face F2 of the mask substrate 50 of the photomask PM and further etching the film. The film with the uniform thickness is formed by supplying a material of the film onto the second face F2 and solidifying the material. The material is not particularly limited and can be either a fluid material or a solid material. The supply method of the fluid material is not particularly limited and can be any of dripping, coating, and spraying. The fluid material can be, for example, coating carbon or resin containing metal and desirably has conductivity. The supply method of the solid material is not particularly limited and can be any of injection, sputtering, and the like. The solidification method of the material is not particularly limited and can be application of IR light, visible light, or UV light, drying, sintering, or the like.

Therefore, the photomask manufacturing apparatus according to the second embodiment can be an etching apparatus capable of etching a film formed on the second face F2. To selectively etch the film formed on the second face F2, it is also possible to further form a resist on the formed film by using a lithography technique and to pattern the resist.

In the case where the photomask PM has the concave portions 61 to 64, the first face F1 of the photomask PM is dented when the photomask PM is mounted on the reticle stage 7 in the EUV exposure apparatus 200. Therefore, ΔZ in Expression 1 is the depth (the size of a level difference) of a concave portion on the first face F1 of the photomask PM.

Figure 6:
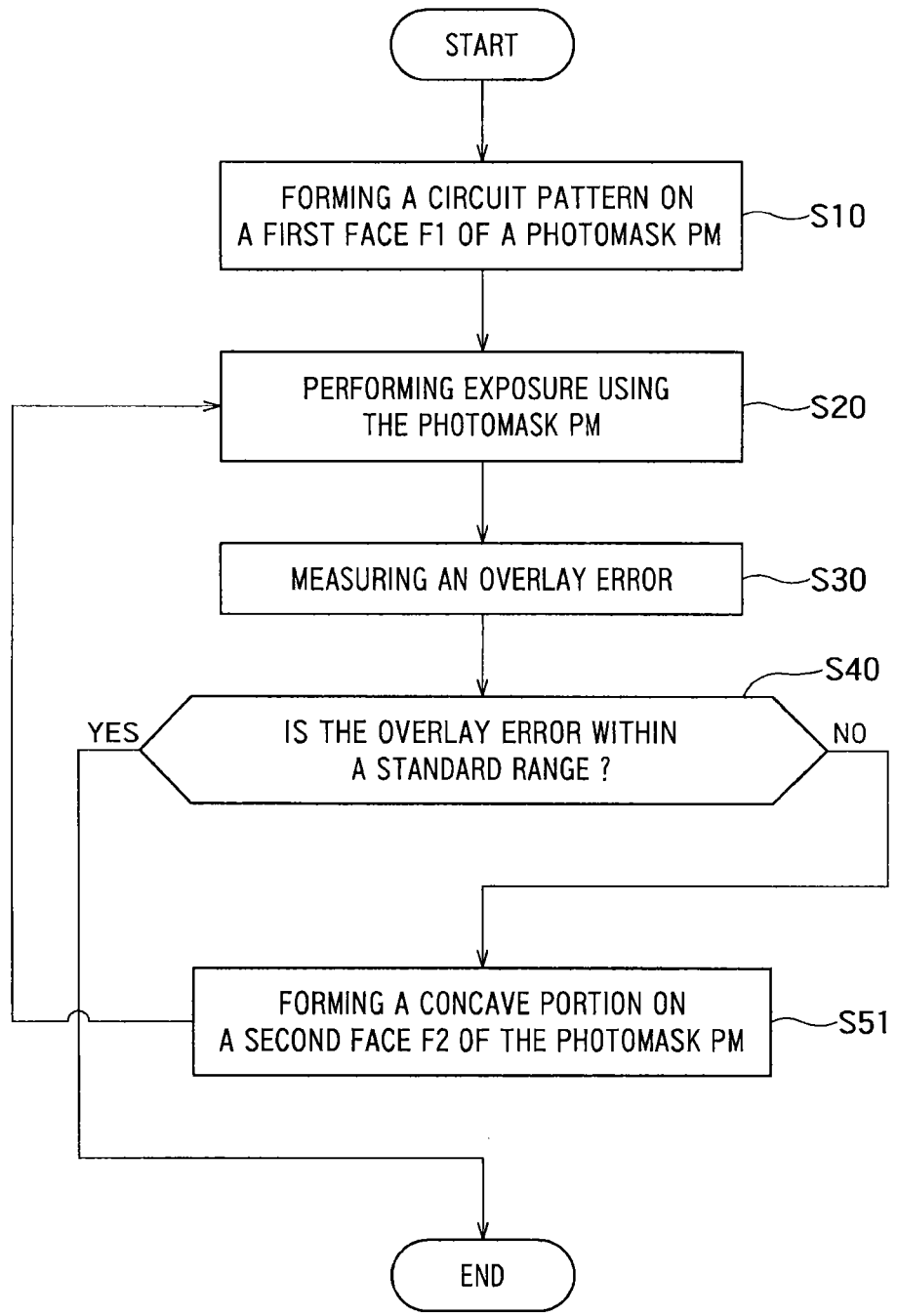
FIG. 6 is a flowchart showing a creation method of the photomask PM according to the second embodiment.

FIG. 6 is a flowchart showing a manufacturing method of the photomask PM according to the second embodiment. After performing the processes at Steps S10 to S40, when an overlay error at a certain grid point is out of the previously set standard range (NO at Step S40), the photomask manufacturing apparatus according to the second embodiment forms concave portions on the second face F2 of the photomask PM (Step S51).

The photomask manufacturing apparatus determines formation positions or the like of the concave portions according to a position of the photomask PM at which an overlay error occurs, a measurement value of the overlay error, and the like. When Expression 1 is used in this case assuming the overlay error as ΔX, the size ΔZ of a level difference required for correction can be calculated. A relation of the size ΔZ of the level difference on the first face F1 and the sizes ΔZ1 and ΔZ2 of the concave portions 61 to 64 and the positions thereof on the second face F2 can be previously set by a simulation such as a stress analysis, statistics, an empirical rule, or the like. It can be confirmed by a simulation that the concave portions 61 to 64 can reduce the overlay error before actually forming the concave portions 61 to 64. After the concave portions 61 to 64 are actually formed, the shapes such as the heights and sizes of the formed concave portions can be measured and then it can be confirmed by a simulation that the concave portions can reduce the overlay error.

At the time of forming the concave portions, a resist is formed on a film formed on the second face F2 of the photomask PM by using a lithography technique and then the resist is patterned. The etching apparatus then selectively etches the second face F2 of the photomask PM. Etching of the second face F2 can be either wet etching or dry etching. In this way, the concave portions can be formed on the second face F2 of the photomask PM.

After the concave portions are formed, the processes at Steps S20 to S40 are performed again. The processes at Steps S20 to S40 are repeated until the overlay error at each grid point falls within the standard range. In this way, the method according to the second embodiment can correct the overlay error. When the number of repetitions of the processes at Steps S20 to S40 exceeds a predetermined value, re-creation of the circuit pattern itself of the photomask PM is conceivable.

As described in the second embodiment, the overlay error on the semiconductor substrate W can be corrected also by forming the concave portions 61 to 64 on the second face (the rear face) of the photomask PM. With this configuration, the second embodiment can achieve effects identical to those of the first embodiment.

Furthermore, the first embodiment and the second embodiment can be combined. That is, the photomask PM can include both of the convex portions and the concave portions on the second face F2. Accordingly, the overlay error can be corrected according to circumstances and the overlay accuracy can be further enhanced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photomask used in order to transfer a pattern to a transfer target substrate in a non-telecentric optical system, the photomask comprising:
   a mask substrate comprising a first face having the pattern formed thereon and a second face on an opposite side from the first face; and
   a convex portion or a concave portion provided on the second face in order to correct a position difference in a transfer pattern occurring when the pattern is transferred to the transfer target substrate, wherein
   the convex portion is formed of a material different from that of the mask substrate.

2. The photomask of claim 1, wherein
   the mask substrate is a glass substrate, and
   the convex portion is formed using carbon or resin.

3. The photomask of claim 1, wherein $$\Delta Z = \Delta X/(\tan\theta \times M) \quad \text{(Expression 1)}$$

Expression 1 holds where a size of a difference in levels on the first face formed by the convex portion or the concave portion at the time of exposure is $\Delta Z$, a correction value of a position of a pattern on the transfer target substrate depending on the size $\Delta Z$ is $\Delta X$, a reduction ratio of a pattern transferred from the photomask to the transfer target substrate is M, and an angle formed by a direction perpendicular to a front face of the photomask and an incidence direction of light entering the photomask is $\theta$.

4. The photomask of claim 2, wherein $$\Delta Z = \Delta X/(\tan\theta \times M) \quad \text{(Expression 1)}$$

Expression 1 holds where a size of a difference in levels on the first face formed by the convex portion or the concave portion at the time of exposure is $\Delta Z$, a correction value of a position of a pattern on the transfer target substrate depending on the size $\Delta Z$ is $\Delta X$, a reduction ratio of a pattern transferred from the photomask to the transfer target substrate is M, and an angle formed by a direction perpendicular to a front face of the photomask and an incidence direction of light entering the photomask is $\theta$.

5. A photomask manufacturing apparatus for manufacturing a photomask used in order to transfer a pattern to a transfer target substrate in a non-telecentric optical system, the apparatus comprising:
   a level-difference formation part forming a convex portion or a concave portion on a second face of a mask substrate of the photomask on an opposite side from a first face of the mask substrate having the pattern formed thereon, the convex portion or the concave portion being provided on the second face in order to correct a position difference in a transfer pattern occurring when the pattern is transferred to the transfer target substrate.

6. The apparatus of claim 5, wherein the level-difference formation part supplies a fluid material onto the second face of the photomask in order to form the convex portion.

7. The apparatus of claim 6, further comprising a solidification part solidifying the fluid material supplied onto the photomask.

8. The apparatus of claim 5, wherein the convex portion is formed of a material different from that of the mask substrate.

9. The apparatus of claim 5, wherein the convex portion is formed of carbon or resin.

10. The apparatus of claim 5, wherein $$\Delta Z = \Delta X/(\tan\theta \times M) \quad \text{(Expression 1)}$$

Expression 1 holds where a size of a difference in levels on the first face formed by the convex portion or the concave portion at the time of exposure is $\Delta Z$, a correction value of a position of a pattern on the transfer target substrate depending on the size $\Delta Z$ is $\Delta X$, a reduction ratio of a pattern transferred from the photomask to the transfer target substrate is M, and an angle formed by a direction perpendicular to a front face of the photomask and an incidence direction of light entering the photomask is $\theta$.

11. A photomask manufacturing method for manufacturing a photomask used in order to transfer a pattern to a transfer target substrate in a non-telecentric optical system, the method comprising:
   forming a convex portion or a concave portion on a second face of a mask substrate of the photomask on an opposite side from a first face of the mask substrate having the pattern formed thereon, the convex portion or the concave portion being provided on the second face in order to correct a position difference in a transfer pattern occurring when the pattern is transferred to the transfer target substrate.

12. The method of claim 11, wherein a fluid material is supplied onto the second face of the photomask in order to form the convex portion.

13. The method of claim 12, further comprising:
solidifying the fluid material supplied onto the photomask.

14. The method of claim 11, wherein the convex portion is formed of a material different from that of the mask substrate.

15. The method of claim 12, wherein the convex portion is formed of carbon or resin.

16. The method of claim 13, wherein the convex portion is formed of carbon or resin.

17. The method of claim 11, wherein the second face of the photomask is etched in order to form the concave portion.

18. The method of claim 11, wherein $$\Delta Z = \Delta X / (\tan \theta \times M) \quad \text{(Expression 1)}$$

Expression 1 holds where a size of a difference in levels on the first face formed by the convex portion or the concave portion at the time of exposure is $\Delta Z$, a correction value of a position of a pattern on the transfer target substrate depending on the size $\Delta Z$ is $\Delta X$, a reduction ratio of a pattern transferred from the photomask to the transfer target substrate is M, and an angle formed by a direction perpendicular to a front face of the photomask and an incidence direction of light entering the photomask is $\theta$.

* * * * *